US010161997B2

(12) United States Patent
Ritter

(10) Patent No.: US 10,161,997 B2
(45) Date of Patent: Dec. 25, 2018

(54) ARRANGEMENT FOR TESTING INTEGRATED CIRCUITS

(71) Applicant: Micronas GmbH, Freiburg (DE)

(72) Inventor: Joachim Ritter, Loerrach (DE)

(73) Assignee: TDK-Micronas GmbH, Freiburg (DE)

( * ) Notice: Subject to any disclaimer, the term of this patent is extended or adjusted under 35 U.S.C. 154(b) by 137 days.

(21) Appl. No.: 14/746,224

(22) Filed: Jun. 22, 2015

(65) Prior Publication Data
US 2015/0369860 A1    Dec. 24, 2015

(30) Foreign Application Priority Data

Jun. 20, 2014   (DE) .................. 10 2014 008 840

(51) Int. Cl.
*G01R 31/28*        (2006.01)
*H01L 21/66*        (2006.01)

(52) U.S. Cl.
CPC .......... *G01R 31/2884* (2013.01); *H01L 22/34* (2013.01)

(58) Field of Classification Search
CPC ...... G01R 31/2884; G01R 31/28; H01L 22/34
See application file for complete search history.

(56) References Cited

U.S. PATENT DOCUMENTS

| 6,366,110 B1 | 4/2002 | Buck |
| 6,888,365 B2 | 5/2005 | Ma et al. |
| 7,741,195 B2 * | 6/2010 | Rashid ............... G01R 31/2884 257/E21.523 |
| 2001/0046168 A1 | 11/2001 | Barth et al. |
| 2007/0241766 A1 * | 10/2007 | Kamitai ................. H01L 22/32 324/750.3 |
| 2008/0290469 A1 | 11/2008 | Grivna et al. |
| 2010/0013059 A1 * | 1/2010 | Hsieh ...................... H01L 21/78 257/620 |
| 2010/0148314 A1 * | 6/2010 | Han ........................ H01L 22/34 257/620 |
| 2010/0164053 A1 * | 7/2010 | Furumiya .......... G01R 31/2884 257/503 |

(Continued)

FOREIGN PATENT DOCUMENTS

| DE | 198 31 563 A1 | 2/2000 |
| DE | 103 42 312 A1 | 4/2004 |
| WO | WO 03/085563 A1 | 10/2003 |

*Primary Examiner* — Son Le
*Assistant Examiner* — Akm Zakaria
(74) *Attorney, Agent, or Firm* — Muncy, Geissler, Olds & Lowe, P.C.

(57) ABSTRACT

An arrangement for testing integrated circuits includes an integrated test circuit and a cluster which has at least one integrated circuit and a second integrated circuit. The first integrated circuit is provided in a first component region of a wafer, and the second integrated circuit in a second component region. The first component region and the second component region are spaced a distance apart by a scribe line of the wafer. The integrated test circuit is connected to the first integrated circuit via a first test line section, and the second integrated circuit is connected to the first test line section via a first connecting line that has a first well in the semiconductor material, the first well extending continuously in the wafer from the first component region over the scribe line to the second component region, the first well being electrically insulated from a substrate of the wafer.

10 Claims, 2 Drawing Sheets

(56) References Cited

U.S. PATENT DOCUMENTS

2013/0026466 A1* 1/2013 Pagani ............... G01R 31/2884
 257/48
2014/0131840 A1 5/2014 Lee et al.

* cited by examiner

ARRANGEMENT FOR TESTING INTEGRATED CIRCUITS

This nonprovisional application claims priority under 35 U.S.C. § 119(a) to German Patent Application No. 10 2014 008 840.5, which was filed in Germany on Jun. 20, 2014, and which is herein incorporated by reference.

BACKGROUND OF THE INVENTION

Field of the Invention

The present invention relates to an arrangement for testing integrated circuits provided in a wafer.

Description of the Background Art

A semiconductor wafer testing system is known from DE 103 42 312 A1, which corresponds to U.S. Pat. No. 6,888,365. Integrated circuits generally begin their manufacturing process in the form of a semiconductor die or integrated circuit, chip or "die" on a flat, circular wafer, which is called a substrate or semiconductor substrate. The semiconductor die usually comprises a rectangular part of the wafer surface and is also known under the designation of integrated circuit, chip, circuit or the like. Each wafer is usually segmented by scribe or saw lines into multiple semiconductor dice, which generally form essentially identical, rectangular structures of integrated circuits. Some semiconductor dice may be design or test semiconductor dice. Other semiconductor dice may be edge semiconductor dice, in which the wafer does not permit the formation of a complete semiconductor die along the edge of the wafer. A slotted region or scribe line is situated between the semiconductor dice on wafers. The size of the scribe line varies with the number and arrangement of semiconductor dice on the wafer. Once the manufacture of the integrated circuit has been completed, the wafer is, e.g., scribed and broken or cut along the scribe line to separate the semiconductor dice for use in component packages. Integrated circuits of the semiconductor dice are tested after manufacturing to ascertain whether a suitable integrated circuit was produced. The integrated circuits may be tested individually after the wafer has been separated. Moreover, the integrated circuits may be measured with the aid of a multi-side testing device before the wafer is separated. A testing of the integrated circuits generally includes the use of mechanical probes of a test apparatus. The mechanical probes are also referred to as probe cards, according to their shape. The mechanical probes contact test terminal areas on the integrated circuit. After the electrical contacting, the test apparatus applies input signals or voltages to the integrated circuit and subsequently receives output signals or voltages from the integrated circuit. The test instrument may have the same number of data testing channels as the number of data terminal areas of the integrated circuit. If an integrated circuit has, for example, eight data terminal areas, for example eight data test channels are connected to the eight test terminal areas on the integrated circuit for reading and writing data.

In addition to the circuit parts and contacts for performing its actual function, an integrated circuit often contains additional circuit parts which are required only once during manufacturing for testing the actual functions. An integrated circuit usually requires a separate interface for providing the test instrument with access. Via this test interface, the circuit is configured for the individual tests, the circuit blocks to be tested are stimulated, and their responses are transmitted to the external test instrument. The integrated circuits may be tested twice during the course of the manufacturing process. The first time, a test takes place after a wafer, which contains multiple integrated circuits of the same type, was manufactured. This test is called the wafer level test. The second time, the integrated circuits are tested after they have been separated and packaged. This test step is also referred to as the final test.

In other test systems, integrated circuits are connected in parallel on the wafer. Each integrated circuit has separate data terminal areas for testing different sections or regions of the integrated circuit. Data terminal areas for similar sections or regions of each integrated circuit are connected, for example, to a wafer test terminal area via a bus or another routing mechanism. DE 103 42 312 A1 also relates to a parallel testing of integrated circuits which are provided in a semiconductor wafer. The semiconductor wafer testing system in DE 103 42 312 A1 tests one or multiple semiconductor die clusters on a semiconductor wafer. A test circuit is used to test multiple sections or regions of each semiconductor die in parallel. The semiconductor wafer testing system has a buffer which is connected to the semiconductor die cluster via the test circuit. The buffer writes test data to one section of each semiconductor die in the semiconductor die cluster. The buffer reads test data from the section of each semiconductor die in the semiconductor die cluster.

An arrangement for testing chips produced from a wafer is known from DE 198 31 563 A1, which corresponds to U.S. Pat. No. 6,366,110, and in which test signals are fed to the chips with the aid of a test head. The test signal may be applied serially or in parallel to the chips in the wafer with the aid of test lines provided in a saw edge of the chips. The saw edge may also be referred to as a kerf or scribe line. Logic units for data compression may be provided in the saw edge.

WO 03/085563, which corresponds to US 2002/0157082, provides for a number of narrow metal paths in the scribe line for the connection between integrated circuits on a wafer. These metal paths are typical less than 0.1 mm long and typically only a few μm wide. These narrow metal paths generate short circuits with only a slight probability during the process of scribing the wafer.

SUMMARY OF THE INVENTION

It is therefore an object of the present invention to refine the prior art. Accordingly, an arrangement for testing integrated circuits is provided. The arrangement has an integrated test circuit. The arrangement also comprises a cluster, which has at least one first integrated circuit and one second integrated circuit.

The first integrated circuit can be provided in a first component region of a wafer. The second integrated circuit can be provided in a second component region of a wafer.

The first component region and the second component region can be spaced a distance apart by a scribe line of the wafer.

The integrated test circuit can be connected to the first integrated circuit at least via a first test line section.

The second integrated circuit can be connected to the first test line section via a first connecting line.

The first electrical connecting line can have a first semiconductor region in the semiconductor material. The first semiconductor region may be provided as a first well and/or be made of polysilicon. The first semiconductor region can extend continuously in the wafer from the first component region over the scribe line to the second component region. The first semiconductor region can be electrically insulated from a substrate of the wafer. It should be noted that the well can have an opposite doping from the substrate. It should furthermore be noted that the polysilicon can have a doping for the purpose of achieving a sufficient electrical conductivity.

According to an embodiment, a significantly smaller chip area is required for the test function, due to the formation of the cluster from a large number of identical integrated circuits. A proportionately large chip area is saved, in particular in integrated circuits having a smaller chip area. To nevertheless facilitate all test functions, the integrated circuits are connected in parallel to the test circuit. Due to the use of the well in the scribe line, a short circuit may be avoided, which could arise due to a smearing of metal material during the separation of the many integrated circuits.

According to an embodiment, the integrated test circuit can be connected to the first integrated circuit via a second test line section. The second integrated circuit can be connected to the second test line section via a second connecting line. The second electrical connecting line can have a second semiconductor region in the semiconductor material. The second semiconductor region may be designed as a second well and/or be made of polysilicon. The second semiconductor region can extend continuously in the wafer from the first component region over the scribe line to the second component region. The second semiconductor region can be electrically insulated from the substrate of the wafer. Due to the second test line section and the second connecting line, at least one second test signal may be transmitted in parallel.

According to an embodiment, the first well can form a first p-n junction to the substrate of the wafer for electrical insulation.

According to an embodiment, the second well can form a second p-n junction to the substrate of the wafer for electrical insulation.

According to an embodiment, a main extension direction of the first well and the second well on the wafer can be predominately designed in the manner of a parallel line. The main extension direction results from the laterally longest dimension of the particular well.

According to an embodiment, a doping polarity of an outer region of the well can be the opposite of the doping polarity of the substrate of the wafer for the purpose of forming a p-n junction.

According to an embodiment, the first connecting line and the second connecting line can be metal-free in the scribe line.

According an embodiment, the first test line section can have a first metal path of a metallization level of the wafer. The first metal path can extend over a first length of the first component region.

According an embodiment, the second test line section can have a second metal path of a metallization level of the wafer. The second metal path can extend over the first length of the first component region.

According to an embodiment, the second well can be electrically insulated from the first well. The electrical insulation can be implemented by a number of p-n junctions. Alternatively, the electrical insulation can be implemented by a dielectric material.

According to an embodiment, at least one additional test circuit can be connected in parallel to the test circuit. A redundancy can be achieved with the aid of the additional test circuit. As a result, the integrated circuits of the cluster may still be tested with the aid of the additional test circuit if one test circuit is defective.

Further scope of applicability of the present invention will become apparent from the detailed description given hereinafter. However, it should be understood that the detailed description and specific examples, while indicating exemplary embodiments of the invention that are combinable, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
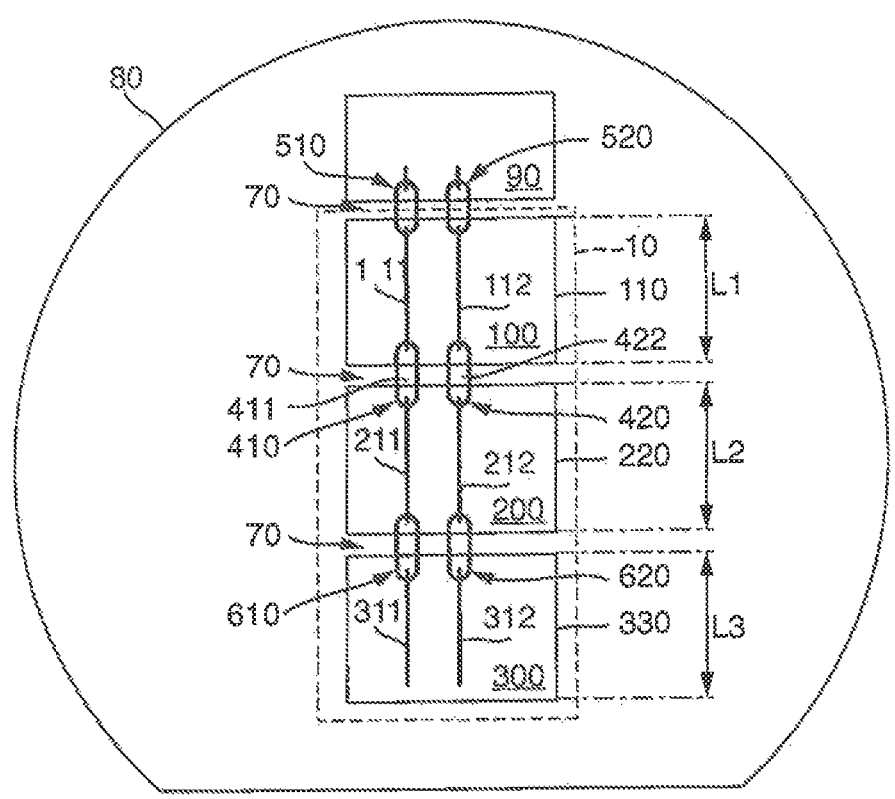
FIG. 1 shows a schematic view of a wafer having integrated circuits.

An arrangement for testing integrated circuits 100, 200, 300 is illustrated schematically in FIG. 1. Integrated circuits 100, 200, 300 are provided in a wafer 80 and have not yet been separated. FIG. 1 also shows an integrated test circuit 90. For the sake of simplicity, no terminal areas for connection to a separate test instrument are shown in FIG. 1. The greatly simplified view in FIG. 1 schematically shows electrical connections 111, 112, 211, 212, 311, 312, 410, 420, 510, 520, 610, 620, which, however, cannot be visible from the outside in the case of a finally processed wafer 80.

FIG. 1 shows a cluster 10 of integrated circuits 100, 200, 300 in wafer 80. Cluster 10 designates a group of integrated circuits 100, 200, 300 disposed adjacent to each other. Integrated circuits 100, 200, 300 usually have a plurality of components. All integrated circuits 100, 200, 300 of cluster 10 are provided in exactly one row or in exactly one column or in multiple rows and/or multiple columns in wafer 80. All integrated circuits 100, 200, 300 of cluster 10 are contained, for example, in a reticle. Cluster 10 usually has a first and a second integrated circuit 100, 200. However, cluster 10 may also have a large number of integrated circuits, deviating from the embodiment in FIG. 1. All integrated circuits 100, 200, 300 of a cluster 10 can have an identical structure, integrated circuits 100, 200, 300 being able to have different characteristics, for example based on process variation. Deviating from the simplified representation in FIG. 1, a plurality of clusters of the same type may be provided on wafer 80.

First integrated circuit 100 is provided in a first component region 110 of wafer 80. On the other hand, second integrated circuit 200 is provided in a second component region 220 of wafer 80. Component regions 110, 220 are explained in greater detail in the embodiment in FIG. 2. First component region 110 and second component region 220 are spaced a distance apart by a scribe line 70 of wafer 80. Scribe line 70 may also be referred to as referred to a scribe lane. In the embodiment in FIG. 1, scribe line 70 is also provided between integrated test circuit 90 and first component region 110 and between second component region 220 and a third component region 330 of a third integrated circuit 300 of cluster 10.

Test circuit 90 in the embodiment in FIG. 1 is wired up for the purpose of testing all integrated circuits 100, 200, 300 of cluster 10. Integrated circuits 100, 200, 300 of cluster 10 are connected in parallel to test circuit 90 for the parallel reception of test signals. Thus, a separate test circuit is not needed for each integrated circuit 100, 200, 300. Test circuit 90 in the embodiment in FIG. 1 is also not integrated into integrated circuits 100, 200, 300 but is disposed separately. In the embodiment in FIG. 1, test circuit 10 is situated adjacent to first integrated circuit 100. Test circuit 90 in the embodiment in FIG. 1 is separated from adjacent integrated circuit 100 by scribe line 70. Alternatively, test circuit 90 may be provided in another position (not illustrated) of wafer 80 and connected to integrated circuits 100, 200, 300 of cluster 10 via lines.

Integrated test circuit 90 is connected to integrated circuits 100, 200, 300 via test line sections 111, 112, 211, 212, 311, 312 and connecting lines 410, 420, 510, 520, 610, 620 for the purpose of testing integrated circuits 100, 200, 300. In the embodiment in FIG. 1, integrated test circuit 90 is connected to first integrated circuit 100 at least via a first test line section 111 and a second test line section 112. In the embodiment in FIG. 1, first test line section 111 and second test line section 112 cross first integrated circuit 100 in the direction of length L1 of first integrated circuit 100.

Second integrated circuit 200 is connected to first test line section 110 via a first connecting line 410 and to second test line section 112 via a second connecting line 420. First connecting line 410 has a first well 411. Second connecting line 420 has a second well 422. A well 411, 422 is created in that a corresponding geometric shape in a reticle defines an introduction (e.g., implantation) of doping agents into the semiconductor material of wafer 80. In the embodiment in FIG. 1, a main extension direction of first well 411 and a main extension direction of second well 422 are provided with an essentially parallel design.

In the embodiment in FIG. 1, a third test line section 211 and a fourth test line section 212 are provided in the region of second integrated circuit 200. Third test line section 211 and fourth test line section 212 cross second integrated circuit 200 in the direction of length L2 of second integrated circuit 200. Third test line section 211 is connected to first connecting line 410, and fourth test line section 211 is connected to second connecting line 420.

In the embodiment in FIG. 1, third integrated circuit 300 is connected to third test line section 211 via a fifth test line section 311 and via a third connecting line 610. Correspondingly, in the embodiment in FIG. 1, third integrated circuit 300 is connected to fourth test line section 212 via a sixth test line section 312 and via a fourth connecting line 620. Fifth test line section 311 and sixth test line section 312 cross third integrated circuit 300 in the direction of length L3 of third integrated circuit 300. Test line sections 111, 112, 211, 212, 311, 312 in the embodiment in FIG. 1 are provided in the same metallization level of wafer 80.

Second integrated circuit 200 is connected to test circuit 90 via third test line section 211 and via first connecting line 410 and via first test line section 111 and via another connecting line 510. Second integrated circuit 200 is likewise connected to test circuit 90 via fourth test line section 212 and via second connecting line 420 and via second test line section 112 and via another connecting line 520. Connecting lines 410, 420, 510, 520, 610, 620 are designed in such a way that they cross the scribe line only perpendicularly.

Figure 2:
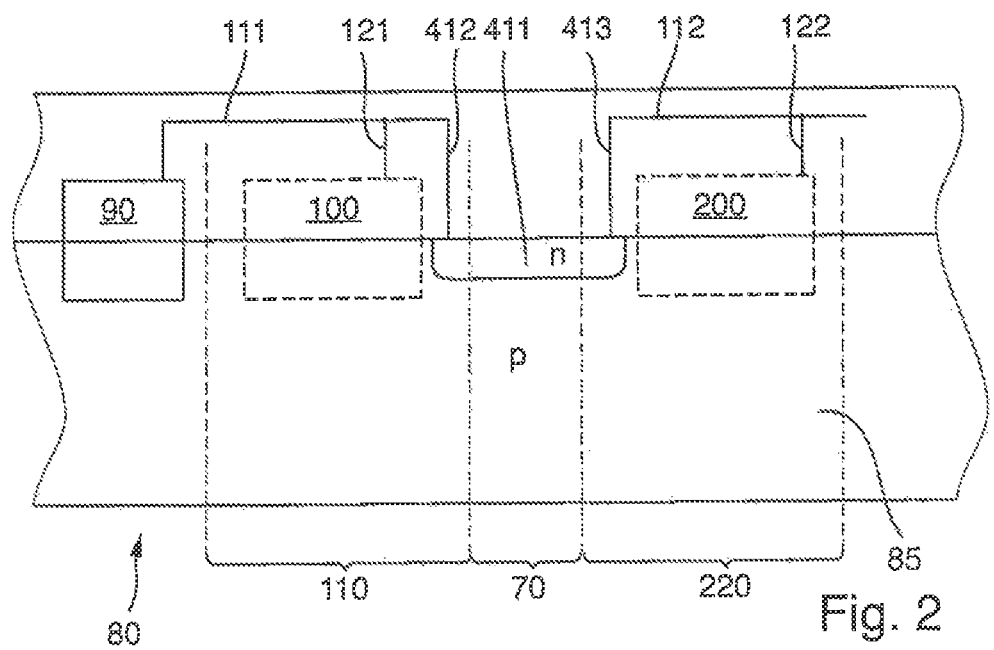
FIG. 2 shows a schematic sectional view of a wafer having integrated circuits.

A sectional view of a wafer 80 is illustrated schematically in FIG. 2. A sectional view of a test circuit 90, a first component region 110 having a first integrated circuit 100, a scribe line 70 and a second component region 220 having a second integrated circuit 200 is shown.

Design rules are applied to the design of integrated circuits 100, 200. Components of first integrated circuit 100 may be provided only within first component region 110, and the latter's boundaries should not overlap. Components of second integrated circuit 200 may be provided only within second component region 220, and the latter's boundaries should also not overlap. On the other hand, the geometric definition of a well 411 is excluded from the design rules, so that well 411 may also extend over a scribe line 70.

Components in first integrated circuit 100 are connected to each other with the aid of metal paths in one or usually multiple metallization levels (not illustrated in FIG. 2). Test line sections 111, 112 are provided as metal paths, for example, in a topmost metallization level. Test line section 111 is connected to first integrated circuit 100 through a via 121. Test line section 211 is connected to second integrated circuit 200 through another via 222.

In the exemplary embodiment, a first well 411 of a first connecting line 410 is illustrated in a sectional view in its main extension direction. First connecting line 410 connects test line section 111 to test line section 211 and thus connects second integrated circuit 200 to first test line section 111 and on to test circuit 90.

Well 411 of first connecting line 410 is formed by doping agents, which form a reverse polarity with respect to the doping agents of a substrate 85 of wafer 80. In the embodiment in FIG. 2, first well 411 is n-doped and substrate 85 is p-doped. Alternatively, substrate 85 may also be n-doped and first well 411 p-doped (not illustrated). Second well 422 according to FIG. 1 is provided with a similar design to first well 411 but is situated laterally at a distance from first well 411. Consequently, first well 411 and second well 412 each form a p-n junction to substrate 85. First well 411 is electrically insulated from substrate 85 of wafer 80 by the p-n junction. The particular p-n junction is operated in the reverse direction for test signals. In the embodiment in FIG. 2, for example, substrate 85 is set to ground potential.

Alternatively or in combination with p-n junctions, the insulation may also be provided with the aid of dielectric materials, e.g., $SiO_2$ (not illustrated).

First well 411 illustrated in the sectional view in FIG. 2, extends continuously in wafer 80 from first component region 110 over scribe line 70 to second component region 220. In first component region 110, first well 411 is connected to first test line section 111 through one or multiple through-connections or vias 412, also referred to as vertical interconnect accesses, of first connecting line 410. In second component region 220, first well 411 is connected to third test line section 211 through one or multiple vias 413 of first connecting line 410. Scribe line 70 is thus metal-free in the region of first well 411. As a result, no metal material is able to smear when first integrated circuit 100 is separated from second integrated circuit 200 and produce an unwanted short circuit with substrate 85 (ground).

Second well 422 according to the illustration in FIG. 1 is provided with a similar design to first well 411. Consequently, second well 422 extends continuously in wafer 80 from first component region 110 over scribe line 70 to second component region 220, second well 220 also being electrically insulated from substrate 85 of wafer 80. The resistance of a well 411, 422 (well resistance) may be set by the doping concentration in well 411, 422.

Figure 3:
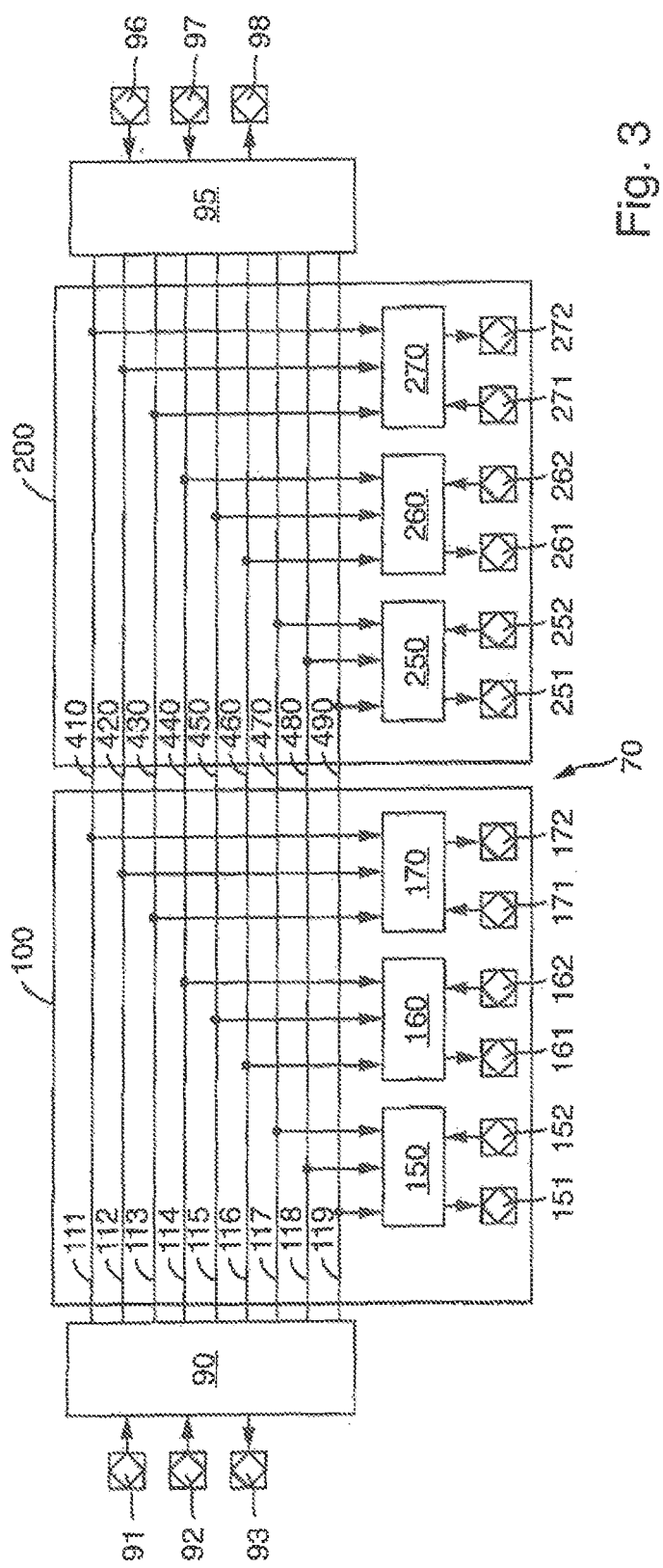
FIG. 3 shows a schematic block diagram.

A block diagram having a first integrated circuit 100 and a second integrated circuit 200 is illustrated schematically in FIG. 3. First integrated circuit 100 has function blocks 150, 160 and 170 for functions A, B and C. Function A is, for example, a measuring signal evaluation, function B is, for example, a communication interface, etc. Second integrated circuit 200 has the same function blocks 250, 260 and 270, which are intended to perform the same functions.

Function blocks 150, 160, 170 of first integrated circuit 100 are connected to test circuit 90 via test line sections 111, 112, 113, 114, 115, 116, 117, 118, 119. Function blocks 250, 260, 270 of second integrated circuit 200 are connected to test line sections 111, 112, 113, 114, 115, 116, 117, 118, 119 via connecting lines 410, 420, 430, 440, 450, 460, 470, 480, 490. Each of connecting lines 410, 420, 430, 440, 450, 460, 470, 480, 490 has a well (not illustrated), which perpendicularly crosses scribe line 70.

Test circuit 90 is disposed outside integrated circuits 100, 200 as a test interface for multiple integrated circuits 100, 200. For each test signal, exactly one line, or multiple lines, run from test circuit 90 in the embodiment in FIG. 3, i.e., the same number of lines as test signals for an integrated circuit 100, 200. All integrated circuits 100, 200 are connected in parallel to test circuit 90 for the purpose of simultaneously receiving all test signals. Integrated circuits 100, 200 have test multiplexers, which are not illustrated.

The test signals may cross first integrated circuit 100 with the aid of test line sections 111, 112, 113, 114, 115, 116, 117, 118, 119 so that the latter do not have to be guided along scribe line 70 and may nevertheless be connected to their neighbor, second integrated circuit 200. Scribe line 70 is crossed perpendicularly or also obliquely for connection purposes. Scribe line 70 is thus not crossed in a metallization level but in a semiconductor layer with the aid of a well (411 in FIG. 2).

Since all integrated circuits 100, 200 are connected in parallel to test circuit 90, the test input signals (stimuli, test modes, configuration) of integrated circuits 100, 200 may be controlled in this manner. The supply inputs and the data inputs of integrated circuits 100, 200 of a cluster 10 may thus be connected to each other. The test signals may also be connected beyond the reticle boundaries. For this purpose, the reticles are used partially in an overlapping manner, a well shape being defined in an overlapping region of the reticles.

The test output signals are output individually per integrated circuit 100, 200 via their terminal areas 151, 152, 161, 162, 171, 172, 251, 252, 261, 262, 271, 272. Terminal areas 151, 152, 161, 162, 171, 172, 251, 252, 261, 262, 271, 272 of integrated circuits 100, 200 may also be used for the applications thereof.

In the embodiment in FIG. 3, two test circuits 90, 95 per cluster 10 are connected in parallel. Each of test circuits 90, 95 in the embodiment in FIG. 3 has separate terminal areas 91, 92, 93, 96, 97, 98 for contacting by a test instrument, which is not illustrated. Both test circuits 90, 95 form a redundancy. The two test circuits 90, 95 simplify the probe card. Moreover, entire cluster 10 does not fail if only one of test circuit 90, 95 is defective.

The invention is not limited to the embodiment variants illustrated in FIGS. 1 through 3. For example, it is possible to combine a much larger number of integrated circuits in a cluster. It is likewise possible to disposed each test circuit 90, 95 differently on the wafer. It is also possible to provide a different geometric shape of test line sections. The functionally of the arrangement according to FIG. 1 may be particularly advantageously used for a combination of a large number of integrated measuring circuits or sensor circuits in a cluster.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An arrangement for testing integrated circuits, the arrangement comprising:
a wafer having a substrate, the substrate having a first surface and a second surface that is opposite from the first surface;
an integrated test circuit that is formed on the first surface of the substrate; and
a cluster that is formed on the first surface of the substrate and that includes at least one first integrated circuit and one second integrated circuit, the first integrated circuit provided in a first component region of a wafer, the second integrated circuit provided in a second component region of the wafer, the first component region and the second component region being spaced a distance apart by a scribe line of the wafer,
wherein the integrated test circuit is connected to the first integrated circuit via a first test line section,
wherein the second integrated circuit is electrically connected to the first test line section through a first connecting line, and
wherein the first connecting line includes a first semiconductor region formed within the substrate of the wafer such that at least a portion of the first semiconductor region is formed between the first surface and the second surface of the substrate, a first through-connection or via formed in the first component region and electrically connected to a first end of the first semiconductor region, a second through-connection or via formed in the second component region and electrically connected to a second end of the first semiconductor region thereby forming electrical connection between the first through-connection or via and the second through-connection or via through the first semiconductor region, and the first semiconductor region being in a semiconductor material, the first semiconductor region extending continuously in the wafer from the first component region over the scribe line to the second component region, the first semiconductor region electrically insulated from the substrate of the wafer.

2. The arrangement according to claim 1, wherein the first semiconductor region includes a first well and/or a polysilicon section.

3. The arrangement according to claim 1, wherein the integrated test circuit is connected to the first integrated circuit via a second test line section, wherein the second integrated circuit is connected to the second test line section via a second connecting line, and wherein the second connecting line has a second semiconductor region or a second well or a second polysilicon region in the semiconductor material, wherein the second semiconductor region extends continuously in the wafer from the first component region over the scribe line to the second component region, and wherein the second semiconductor region is electrically insulated from the substrate of the wafer.

4. The arrangement according to claim 3, wherein the first well forms a first p-n junction to the substrate of the wafer for the electrical insulation and/or the second well forms a second p-n junction to the substrate of the wafer for electrical insulation.

5. The arrangement according to claim 2, wherein a main extension direction of the first semiconductor region and the second semiconductor region or the first well and the second well is provided on the wafer predominantly in the manner of a parallel line.

6. The arrangement according to claim 1, wherein a doping polarity of an outer region of the well is a reverse of a doping polarity of the substrate of the wafer for forming a p-n junction.

7. The arrangement according to claim 1, wherein the first connecting line and/or the second connecting line is metal-free in the scribe line.

8. The arrangement according to claim 1, wherein the first test line section has a first metal path of a metallization level of the wafer, the first metal path extending over a first length of the first component region, and/or wherein the second test line section has a second metal path of a metallization level of the wafer, the second metal path extending over the first length of the first component region.

9. The arrangement according to claim 1, wherein the second well is electrically insulated from the first well.

10. The arrangement according to claim 1, wherein at least one additional test circuit is connected in parallel to the test circuit.

* * * * *